US007337267B1

(12) United States Patent
Pereira et al.

(10) Patent No.: US 7,337,267 B1
(45) Date of Patent: Feb. 26, 2008

(54) HIERARCHICAL, PROGRAMMABLE-PRIORITY CONTENT ADDRESSABLE MEMORY SYSTEM

(75) Inventors: Jose P. Pereira, Cupertino, CA (US);
Sunder R. Raj, Marlboro, NJ (US);
David Ng, Redwood City, CA (US)

(73) Assignee: NetLogic Microsystems, Inc, Mountain View, CA (US)

( * ) Notice: Subject to any disclaimer, the term of this patent is extended or adjusted under 35 U.S.C. 154(b) by 309 days.

(21) Appl. No.: 10/776,441

(22) Filed: Feb. 10, 2004

(51) Int. Cl.
*G06F 12/00* (2006.01)

(52) U.S. Cl. .......................... 711/108; 711/158; 707/6; 370/392; 365/49

(58) Field of Classification Search ................ 711/108, 711/158; 257/724; 365/49; 707/10, 6; 370/392
See application file for complete search history.

(56) References Cited

U.S. PATENT DOCUMENTS

| 5,440,715 | A | | 8/1995 | Wyland |
| 5,467,349 | A | * | 11/1995 | Huey et al. ................. 370/397 |
| 6,122,707 | A | | 9/2000 | Schultz et al. |
| 6,148,364 | A | | 11/2000 | Srinivasan et al. |
| 6,230,236 | B1 | * | 5/2001 | Schultz et al. ............. 711/108 |
| 6,317,350 | B1 | | 11/2001 | Pereira et al. |
| 6,324,087 | B1 | * | 11/2001 | Pereira ........................ 365/49 |
| 6,493,793 | B1 | | 12/2002 | Pereira et al. |
| 6,521,994 | B1 | * | 2/2003 | Huse et al. ................. 257/724 |
| 6,539,455 | B1 | * | 3/2003 | Khanna et al. ............. 711/108 |

FOREIGN PATENT DOCUMENTS

JP 08/273376 10/1996

OTHER PUBLICATIONS

Hayashi, T. and Miyazaki, T., "High-Speed Table Lookup Engine for IPv6 Longest Prefix Match," IEEE Global Telecommunications Conference—Globecom 1999, pp. 1576-1581.
Patent Abstracts of Japan, Pub. No. 08273376 entitled "Associative Memory System," published Nov. 18, 1996.

* cited by examiner

*Primary Examiner*—Matthew Kim
*Assistant Examiner*—Hetul Patel
(74) *Attorney, Agent, or Firm*—Shemwell Mahamedi LLP

(57) ABSTRACT

A hierarchical programmable-priority content addressable memory (CAM) system including first, second and third CAM devices. The first CAM device has a first priority number output and a first enable input. The second CAM device has a priority number input and an enable output coupled to the priority number output and the first enable input, respectively, of the first CAM device. The second CAM device also has a priority number output and an enable input. The third CAM device has a priority number input and an enable output coupled to the priority number output and the enable input, respectively, of the second CAM device.

49 Claims, 8 Drawing Sheets

PRIOR-ART

PRIOR-ART

HIERARCHICAL, PROGRAMMABLE-PRIORITY CONTENT ADDRESSABLE MEMORY SYSTEM

FIELD OF THE INVENTION

The present invention relates generally to content addressable memory devices, and more particularly to cascaded content addressable memory devices.

BACKGROUND

Content addressable memory (CAM) devices are often used in network switching and routing systems to determine forwarding destinations and permissions for data packets. A CAM device can be instructed to compare a search key obtained from an incoming packet with contents of a forwarding or classification database (referred to collectively herein as a search database) stored in an associative storage array within the CAM device. If the search key matches an entry in the database, the CAM device generates a match address that corresponds to the matching entry, and asserts a match flag to signal the match. The match address is then typically used to address another storage array, either within or separate from the CAM device, to retrieve forwarding information for the packet.

In many cases, the search database is too large to be stored within a single CAM device and is instead distributed within multiple CAM devices that collectively constitute a CAM system. A search operation within the CAM system involves simultaneously searching the search database components in each of the constituent CAM devices and, if matches are detected in more than one CAM device, resolving between the corresponding match addresses according to a prioritizing policy. In some CAM systems, multiple match conditions are resolved by an ASIC (application-specific integrated circuit) or other back-end processing device that receives search results from each of the constituent CAM devices. In other CAM systems, commonly referred to as cascaded CAM systems, multiple match conditions are resolved by the constituent CAM devices themselves.

In a relatively simple class of cascaded CAM systems, each of the constituent CAM devices has a fixed priority relative to the other constituent CAM devices so that multiple match conditions may be resolved based solely on the identities of the match-detecting CAM devices. For example, in a cascade of eight CAM devices having priorities ranging from highest to lowest, a match address generated by the highest priority device will always have a higher priority (and therefore be selected for output) over a match address generated by any of the lower priority CAM devices.

In a more complex class of cascaded CAM systems, the priorities of individual entries in the search database are programmable, for example, to simplify the insertion and deletion of database entries having intermediate priorities. In such programmable-priority CAM systems, each constituent CAM device having a key-matching entry outputs both the match address and a corresponding priority value and wherein resolution of multiple match conditions involves a comparison of priority values output by competing CAM devices to determine a priority winner.

FIG. 1 illustrates a prior-art programmable-priority CAM system 100 having three CAM devices (CAM1, CAM2 and CAM3) coupled in cascade. The CAM devices simultaneously search their respective databases for entries that match an incoming search key (KEY) and generate respective search results that each include a match flag, priority number and match address. The match flag indicates whether a match was detected and therefore whether the corresponding priority number and match address are valid, and the priority number, if valid, indicates the priority of the corresponding match address. The priority numbers produced by the CAM devices ripple both downward and upward through the sequence of CAM devices (i.e., from CAM1 to CAM2 to CAM3, and from CAM3 to CAM 2 to CAM1) in a timed progression (e.g., timed by a system clock signal) and according to the following logic:

Each CAM device waits to receive a logic-low signal at its cascade-down input (CDI), then (1) asserts a logic-low signal at its cascade-down output (CDO) (which is otherwise held high) and (2) compares its self-produced priority number (i.e., local priority number) with a priority number presented at its cascade-down input (PDI) and outputs the priority winner (i.e., the local priority number if both valid and numerically equal to or lower than the priority number at the PDI, and otherwise the priority number at the PDI) at its priority-down output (PDO); and Each CAM device waits to receive a logic-low signal at its cascade-up input (CUI), then (1) asserts a logic-low signal at its cascade-up output (CUO) (which is otherwise held high) and (2) compares its local priority number with a priority number presented at its cascade-up input (PUI) and outputs the priority winner at its priority-up output (PUO)

Each CAM device outputs its match address onto the output bus upon determining that its local priority number is the priority winner in the comparison with the priority number presented at the PDO and in the comparison with the priority number presented at the PDI.

CAM1, by virtue of its ground-connected CDI, is the first device to compare its local priority number to the priority number presented at its PDI, and outputs the priority winner to the PDI of CAM2. CAM1 also lowers the signal at the CDI of CAM2, enabling CAM2 to compare its local priority number to the priority winner delivered by CAM1 and, in turn, to output a priority winner to CAM3. CAM3, receives a low signal from CAM2 at its CDI and, in response, compares its local priority number to the priority winner delivered by CAM2 to complete the downward ripple of priority numbers. An upward ripple of priority comparisons is carried out simultaneously with, and in the same manner as, the downward ripple using the CUI, PUI, CUO and PUO pins of each CAM device. By this operation, if a given CAM device has in fact detected a highest priority match (i.e., HPM: a match address for which the corresponding priority number has a higher priority than the priority numbers associated with any other match addresses generated within the CAM system 100), then the CAM device will eventually determine its local priority number to be the winner of comparisons performed in both the upward and downward rippling of priority numbers and, in response, enable the HPM onto output bus 103.

Reflecting on the up/down priority number rippling in CAM system 100, it is evident that the longest-latency HPM determination occurs when the CAM device at either end of the device cascade, CAM1 or CAM3, is the source of the HPM. Stated generally, because N priority number comparisons are performed in sequence to traverse a cascade of N CAM devices, the worst-case HPM latency is proportional to the number of CAM devices in the system. Consequently, the maximum tolerable HPM latency for a given application constrains the number of CAM devices that may be cascaded using the up/down priority number rippling technique of system 100.

FIG. 2 illustrates another prior-art programmable-priority CAM system 150 referred to herein as a master-slave CAM system. In the master-slave CAM system 150, a master CAM device (MASTER), and a set of N slave devices (SLAVE$_1$-SLAVE$_N$) each simultaneously search their respective databases for entries that match an incoming search key (KEY), producing respective match flags, match addresses and priority numbers. The master CAM device receives a match flag and corresponding priority number (MF, P) from each of the slave CAM devices, and compares the slave-supplied priority numbers with one another and with its own local priority number to determine a priority winner (e.g., a lowest numerical priority number for which the corresponding match flag is asserted). If the local priority number is the priority winner, the master CAM device outputs the corresponding match address onto output bus 153 as the HPM. If one of the slave CAM devices sourced the priority winner, the master CAM device outputs an enable signal to the slave device (i.e., one of enable signals, E$_1$-E$_N$) to enable the slave device to output the HPM onto output bus 153.

By centralizing the priority number comparison operation within a single CAM device (i.e., the master CAM device), the per-device latency penalty of the up/down priority number rippling embodiment is avoided, but at the cost of significantly increasing the pin count of the CAM devices (i.e., assuming, as is desirable, that each of the CAM devices can be interchangeably operated as a master or slave) and signal routing complexity. For example, in a master-slave CAM system having a master CAM device and seven slave CAM devices, each of which generates a 12-bit priority number, 84 pins are consumed by the priority number interface alone (additional pins are consumed by the match flag inputs and enable outputs), thus increasing the cost of the CAM devices and therefore the overall system. The increased signal routing complexity may necessitate additional circuit board layers to achieve the required master-slave interconnections without path conflicts, further increasing system cost.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

Figure 2:
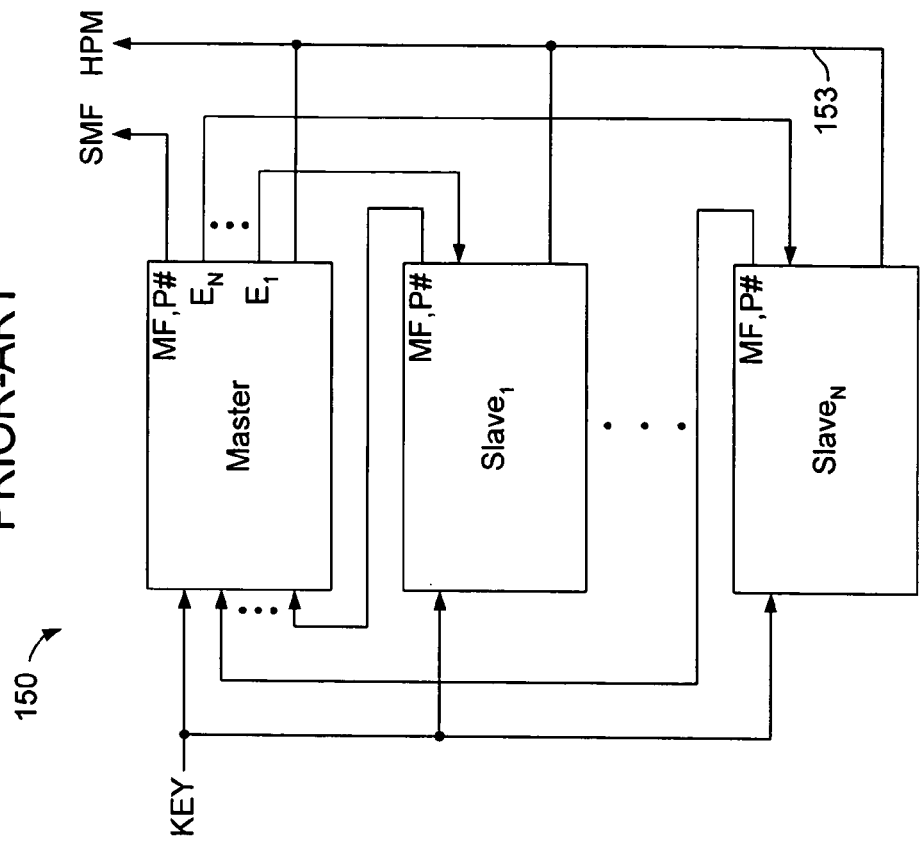
FIG. 2 illustrates another prior-art programmable-priority CAM system.

In the following description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single-conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa. Signals shown or described as having simultaneous rise and/or fall times may be, in fact, offset by a small delay resulting, for example, from manufacturing variations, differences in signal generation circuits or signal paths, propagation delay (e.g., where one of the signals is used to enable generation of the other) and so forth. Similarly, signals described or depicted as having active-high or active-low logic levels may have opposite logic levels in alternative embodiments. As another example, circuits described or depicted as including metal oxide semiconductor (MOS) transistors may alternatively be implemented using bipolar technology or any other technology in which a signal-controlled current flow may be achieved. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "terminal" is used to mean a point of electrical connection. The term "exemplary" is used to express but an example, and not a preference or requirement.

In embodiments of the present invention, programmable-priority CAM devices are interconnected to form a hierarchical, programmable-priority CAM system in which a top-tier CAM device operates as a master CAM device, one or more bottom-tier CAM devices operate as slave CAM devices and mid-tier CAM devices operate as both slave CAM devices to higher-tier CAM devices and master CAM devices to lower-tier CAM devices. During a search operation, each CAM device in the hierarchy performs a database search, producing a match flag, match address and priority value. Priority values and match flags generated by bottom-tier CAM devices are output to mid-tier CAM devices each of which resolves a local priority winner between one or more incoming priority values and a local (i.e., self-produced) priority value, then outputs the local priority winner to the next-higher-tier CAM device which responds, in turn, by resolving and outputting its own local priority winner. Thus, local priority winners ripple up through the tiers of CAM devices to reach the top-tier CAM device which resolves a final priority winner.

If the priority value produced by the top-tier CAM device is the final priority winner, the top-tier CAM device outputs its local (i.e., self-produced) match address onto a result bus as the highest priority match address (HPM), an operation referred to herein as sourcing the HPM. Otherwise, the top-tier CAM device outputs a match enable signal to the CAM device in the tier below that produced or forwarded the final priority winner. In one embodiment, each mid-tier CAM device responds to a match enable signal by repeating the operations of the top-tier CAM device, either sourcing the HPM or outputting a match enable signal to a lower-tier CAM device depending on whether the local priority winner within the mid-tier CAM device was produced by the mid-tier CAM device or provided by a CAM device in the tier below. By this operation, match enable signals ripple downward through the hierarchy of CAM devices, hopping from tier to tier, until either a mid-tier CAM device sources the HPM, or a bottom tier CAM device receives an enable signal, in which case the bottom tier CAM device sources the HPM.

Figure 1:
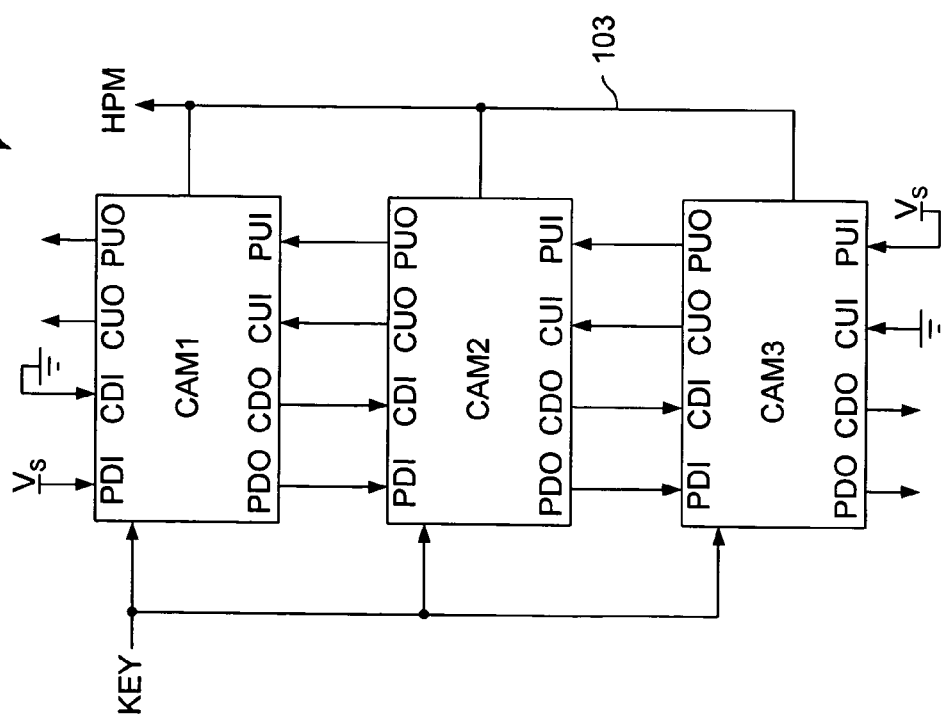
FIG. 1 illustrates a prior-art programmable-priority CAM system.

Assuming that each CAM device in the hierarchy includes inputs for receiving priority values from up to N lower-tier CAM devices, then relatively large numbers of CAM devices may be coupled in a hierarchical, programmable-priority CAM system without the extended HPM latency or pin consumption that plague the prior art programmable-priority CAM systems described in reference to FIGS. 1 and 2. That is, in a hierarchical, programmable-priority CAM system having T tiers of CAM devices, a fully populated CAM system (i.e., each priority value input to a mid-tier or top-tier CAM device is coupled to a lower-tier CAM device) includes $N^{T-1}+N^{T-2}+\ldots+N^0$ CAM devices. Thus, if N=4 and T=4 (more or fewer priority number inputs per CAM device and more or fewer tiers may be provided in alternative embodiments), then a fully populated hierarchical CAM system includes 85 (64+16+4+1) CAM devices each having only four priority value inputs and in which the HPM is sourced after three (T−1) stages of priority number comparisons and three or fewer match enable hops (the match enable hops being relatively fast as no priority value comparisons are required). By contrast, if the prior-art ripple up/down system of FIG. 1 is expanded to include 85 CAM devices, as many as 84 priority number comparisons may need to be performed, one after another, to resolve the HPM. If the prior-art master/slave system of FIG. 2 is expanded to include 85 CAM devices, the master device (and the slave CAM devices assuming the devices to be interchangeable) would require enough pins to receive 84 priority values; over a thousand pins in the case of an exemplary 12-bit priority value.

In an alternative embodiment of the invention, referred to herein as a cumulative-enable embodiment, match-enable rippling is eliminated to further reduce HPM latency. In a cumulative-enable embodiment, each CAM device in the hierarchy is coupled to receive a respective enable signal from a CAM device at each higher tier in the CAM device hierarchy and is configured to wait until all the enable signals are asserted before sourcing the HPM (i.e., HPM is sourced when enable signals are received at all enable inputs and the self-produced priority value has been determined to be the local priority winner). That is, viewing the CAM device hierarchy as a family tree structure, then a CAM device at a given level of the hierarchy is coupled to receive distinct match signals from its parent (i.e., higher-tier CAM device that receives the priority number directly from the subject CAM device), grandparent, great grandparent and so forth. By this arrangement, as each local priority winner is determined within a given family of CAM devices (i.e., CAM device and all its descendants within the hierarchy), the CAM device that produced the local priority winner receives a match enable signal or, if the CAM device performing the priority value comparison produced the local priority winner, stores an internal state to indicate a local priority winner status. Consequently, if a given CAM device will ultimately be determined to be the source of the final priority winner, the CAM device will cumulatively receive match enable signals from each ancestor CAM device (i.e., parent, grandparent, great grand parent and so forth) concluding with receipt of a final match enable signal from the top-tier CAM device. Consequently, as soon as the final match enable signal is asserted, the CAM device that produced the final priority winner is enabled to source the HPM, thus avoiding the need to wait for match enable signals to ripple down through the ancestor CAM devices. These and other embodiments and aspects of the invention are described in further detail below.

Figure 3:
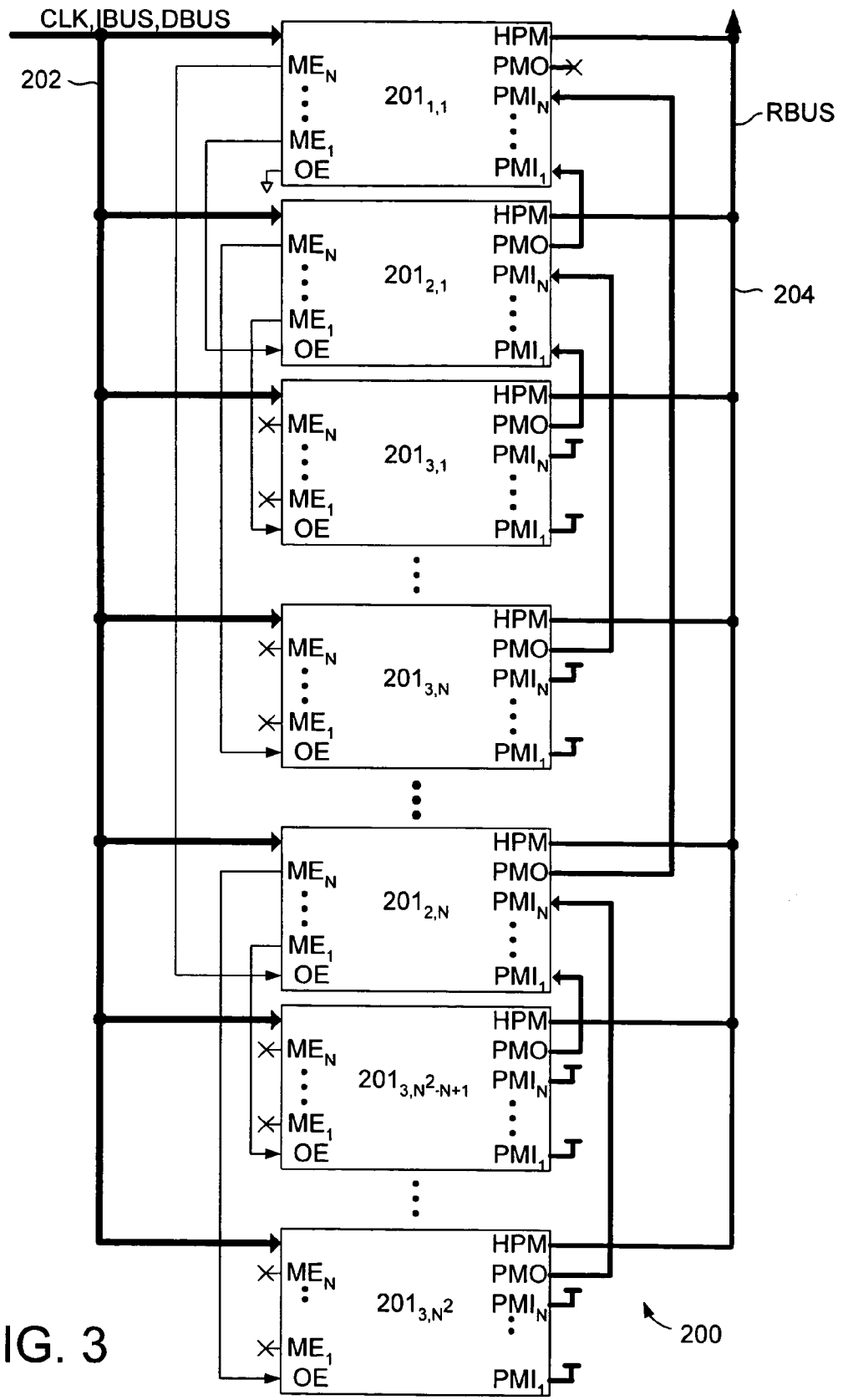
FIG. 3 illustrates a hierarchical programmable-priority CAM system according to an embodiment of the invention.

FIG. 3 illustrates a hierarchical programmable-priority CAM system 200 according to an embodiment of the invention. CAM system 200 includes a plurality of CAM devices 201 each coupled to a common signal path 202 or group of signal paths for receiving instructions and search keys from one or more host devices (e.g., a network processor, general-purposes processor, ASIC and/or other control device). The signal path 202 or a portion thereof may additionally be used to transfer data to and from the CAM devices 201 during database read and write operations and to deliver timing information to the CAM devices 201 (e.g., one or more clock signals generated by a host device or other clock generating device). Each of the CAM devices 201 is additionally coupled to a result bus 204 (RBUS) that is used to deliver highest priority match addresses (HPMs) to one or more host device and/or to an associated storage.

In FIG. 3, each of the CAM devices 201 is distinguished by a two-digit subscript "X,Y", with X indicating the tier of the CAM device within the hierarchy and Y being an enumeration of CAM devices within a given tier. Thus, CAM device $201_{1,1}$ is the first and only device in tier 1 (i.e., the top-tier device in the hierarchy), CAM devices $201_{1,1}$-$201_{2,N}$ constitute N mid-tier devices, and CAM devices $201_{3,1}$-$201_{3,N^2}$ constitute $N^2$ third-tier devices. As a matter of terminology, the top-tier CAM device is said to be the parent of mid-tier devices $201_{2,1}$-$202_{2,N}$ and the grand parent of bottom-tier CAM devices $201_{3,1}$-$201_{3,N^2}$. Each of the mid-tier CAM devices $201_{2,J}$ (J ranging from 1 to N) is the parent of N bottom-tier CAM devices $201_{3,(J-1)\cdot N+1}$-$201_{3,J*N}$ (e.g., mid-tier CAM device $201_{2,1}$ is the parent of bottom-tier CAM devices $201_{3,1}$-$201_{3,N}$ and mid-tier CAM device $201_{2,N}$ is the parent of bottom-tier CAM devices $201_{3,N^2-N+1}$-$201_{3,N^2}$). Conversely, the CAM devices 201 coupled to a given parent CAM device are referred to as child CAM devices with respect to that parent and more generally, descendants of the parent CAM device, grandparent CAM device, great-grandparent CAM device and so forth. With respect to a given child CAM device, the parent CAM device, grandparent CAM device, great-grandparent CAM device (and so forth) are referred to as ancestors. Finally, a CAM device and its descendants are referred herein to as a family. Thus, in the embodiment of FIG. 3 the entire system of CAM devices constitutes a family headed by top-tier CAM device $201_{1,1}$, and each mid-tier CAM device heads a family consisting of itself and its child CAM devices. Additional tiers of CAM devices may be provided in alternative embodiments.

The CAM system 200 responds to a host-supplied search instruction and search key by carrying out a multi-phase search operation. In the first phase, referred to herein as the primary search phase, the individual CAM devices 201 concurrently search their local (i.e., internally maintained) databases for key-matching entries and produce corresponding local match results. Each local match result includes a match address and a corresponding priority-match (PM) value. The PM value itself includes a match flag that indicates whether a key-matching entry was detected within the local database and a priority number that corresponds to the match address and reflects the priority of the key-matching entry relative to other entries within the local database. In one embodiment, the match flag is a single-bit active low signal and the priority numbers are multi-bit entities that indicate priorities in inverse proportion to their numeric value. Thus, a match indication is indicated by a logic low match flag, and priority numbers having lower numeric values indicate a higher priority than priority numbers having higher numeric values (other priority ordering schemes and/or opposite match flag logic states may be used in alternative embodiments). Using this scheme, the match flag may be viewed as a most-significant bit of a PM value so that any PM value having a low match flag (i.e., match detected) is ensured to have a lower numeric value, and therefore a higher priority, than any PM value having a high match flag (i.e., no match detected). If multiple key-matching entries are detected within a given CAM device 201 (i.e., a multiple match condition), priority resolution logic within the CAM device produces a match address and PM value that correspond to the key-matching entry associated with priority number having the highest priority.

During a second phase of the search operation, referred to herein as the secondary search phase, PM values generated within the CAM devices 201 are compared with each other to identify a system-wide priority winner, referred to herein as a final priority winner. In a final phase of the search operation, the CAM device that produced the final priority winner is enabled to output its local match address onto the result bus, thus sourcing the HPM.

In one embodiment, the secondary search phase is achieved through PM value compare operations that are carried out sequentially in each tier of CAM devices 201, starting in the bottom tier CAM devices $201_{3,1}$-$203_{3,N}{}^2$ and culminating in identification of a highest priority PM value (the final priority winner) in the top-tier CAM device $201_{1,1}$. In the embodiment of FIG. 3, each of the CAM devices 201 includes a set of priority-match inputs ($PMI_1$-$PMI_N$) to receive as many as N PM values from respective child CAM devices, a cascade logic circuit to resolve a local priority winner as between the local (i.e., self-produced) PM value and the PM values received via the priority-match inputs (referred to herein as remote PM values to distinguish them from the local PM value), and a priority-match output (PMO) to output the local priority winner to the priority-match input of a parent CAM device.

In the embodiment of FIG. 3, the priority-match inputs of each bottom tier CAM device $201_{3,1}$-$201_{3,N}{}^2$ are tied high (e.g., to a supply voltage node) so that the local PM value will be compared with PM values having a lowest-possible priority. Thus, if the local PM value indicates a match within a bottom tier CAM device, it is ensured to be the local priority winner that is supplied to the parent CAM device. Otherwise a PM value having a deasserted match flag is supplied to the parent CAM device. After the local priority winners generated by the bottom-tier CAM devices $201_{3,1}$-$201_{3,N}{}^2$ become valid at the priority-match inputs of the mid-tier CAM devices $201_{2,1}$-$201_{2,N}$, each mid-tier CAM device performs a priority comparison to determine a local priority winner as between its local PM value and the remote PM values provided by the child CAM devices, the local priority winner being output to the top-tier CAM device $201_{1,1}$ via the priority-match output. After the local priority winners generated by the mid-tier CAM devices $201_{2,1}$-$201_{2,N}$ become valid at the priority-match inputs of the top-tier CAM device $201_{1,1}$, the top tier CAM device determines the local priority winner which, by virtue of the position of the top-tier CAM device at the top of the system hierarchy, constitutes the final priority winner. In one embodiment, the top-tier CAM device $201_{1,1}$ operates in the same manner as lower-tier CAM devices, outputting the final priority winner at its priority-match output. Alternatively, the top-tier CAM device may detect or be programmed with information indicating its top-tier status and refrain from outputting the final priority winner at its priority-match output. Also, the priority-match output of the top-tier CAM device $201_{1,1}$ may be left unconnected as shown in FIG. 3 or, in an alternative embodiment, the priority-match output or component outputs thereof may be coupled to a portion of the result bus or another output signal path. For example, in one embodiment, the match flag component of the final priority winner is used to drive a system match flag to indicate whether a match has been detected within the hierarchical CAM system. In another embodiment, the priority number component of the final priority winner is output onto the result bus (or other signal path) to enable a determination of the priority of the HPM (e.g., for comparison with priority of match results generated by one or more other CAM systems).

After a match-indicating final priority winner is resolved by the top-tier CAM device $201_{1,1}$, the final phase of the search operation is initiated. In the final phase, one or more output enable operations are executed to enable the CAM device that produced the final priority winner to output its local match address onto the result bus (i.e., source the HPM). In one embodiment, referred to herein as a sequential-enable embodiment, each CAM device 201 in the hierarchy waits to receive an active-low match enable signal at an output enable input (OE) before executing an output enable operation. Match enable signals are issued in sequence from one tier of CAM devices 201 to the next, progressing downward through the hierarchy of CAM devices 201 until the CAM device that produced the final priority winner is reached. Upon receiving a match enable signal, a CAM device 201 executes an output enable signal by either (1) outputting its match address onto the result bus (i.e., sourcing the HPM) if the local PM value was the local priority winner or (2) outputting a match enable signal to the child CAM device that provided the local priority winner. As shown in FIG. 3, the output enable input of the top-tier CAM device $201_{1,1}$ is tied low so that, as soon as the final priority winner is resolved, the top tier CAM device $201_{1,1}$ is enabled to execute an output enable operation and thus either sources the HPM (if the local PM value of the top tier CAM device $201_{1,1}$ was the final priority winner) or outputs a match enable signal to a child CAM device (i.e., one of mid-tier CAM devices $201_{2,1}$-$201_{2,N}$) via one of match enable outputs $ME_1$-$ME_N$ according to the final priority winner. If the top-tier CAM device $201_{1,1}$ did not source the final priority winner, then the mid-tier CAM device that provided the final priority winner will receive a match enable signal at its output enable input and perform an output enable operation in response. That is, the mid-tier CAM device will either source the HPM or output a match enable signal to one of the bottom-tier CAM devices in its family according to the local priority winner previously determined within the mid-tier CAM device. If the mid-tier CAM device did not produce the local priority winner, then the bottom-tier CAM device that provided the local priority winner to the mid-tier CAM device will receive a match enable signal at its output enable input and thus be enabled to perform an output enable operation. Because the bottom tier CAM device received no valid PM values from lower tier CAM devices, the bottom tier CAM device is the local priority winner (i.e., in the comparison performed by the bottom tier CAM device) and therefore sources the HPM.

Reflecting on the embodiment of FIG. 3, it should be noted that a number of changes may be made without departing from the spirit and scope of the present invention. First, while all CAM devices are depicted as having identical numbers of inputs and outputs to permit interchangeability, this is unnecessary. In alternative embodiments, hierarchical programmable-priority CAM systems may be constructed using CAM devices having different numbers of priority-match inputs and match enable outputs. Also, CAM devices having no priority-match inputs or match enable outputs may be used. Further, as the priority-match output (or at least the pins used to output a priority number) may be unused on the top-tier CAM device $201_{1,1}$ and the priority-match inputs are unused on the bottom tier CAM devices $201_{3,1}$-$201_{3,N^2}$, one or more of the priority-match ports may be selectively configured (e.g., by configuration register setting, strapping, etc.) as either an input or an output, thereby conserving pins within the CAM devices that populate the hierarchical CAM system 200.

Figure 4:
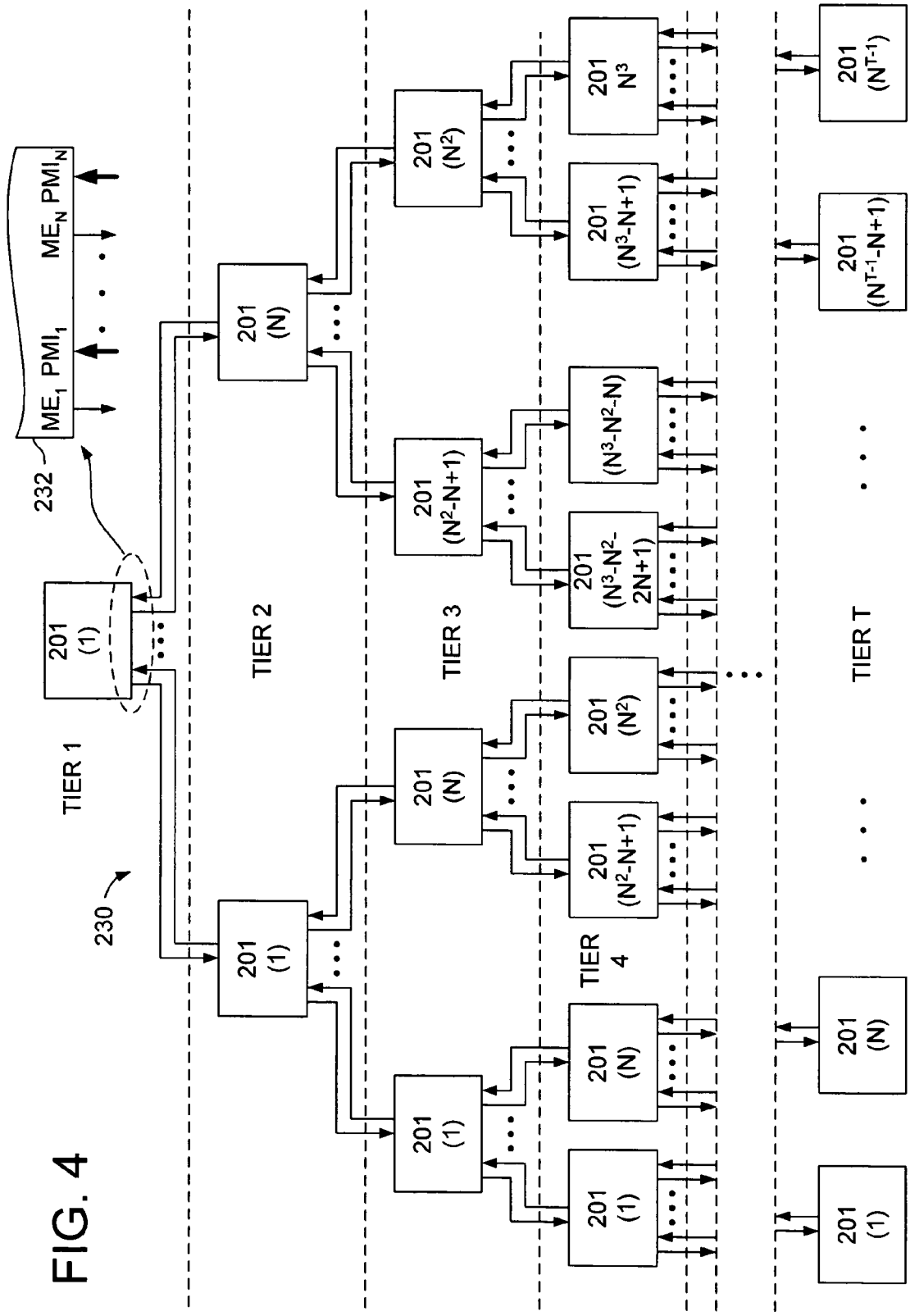
FIG. 4 illustrates a generalized hierarchical programmable-priority CAM system having T tiers of CAM devices.

FIG. 4 illustrates a generalized hierarchical programmable-priority CAM system 230 having T tiers of CAM devices 201, each having input/output (I/O) interfaces and internal circuitry for supporting up to N child CAM devices (i.e., having N match enable outputs and N priority-match inputs as shown at 232) so that the total number of CAM devices in a fully populated hierarchy is $N^{T-1}$+ $N^{T-2}$+ . . . +$N^0$. Thus, if N=2 and T=5, then the CAM system may include as many as 16+8+4+2+1=31 CAM devices. Conversely, if N=8 and T=3, then the CAM system may include as many as 64+8+1=73 CAM devices. More generally, any number of hierarchical tiers and child CAM devices per parent CAM device may be provided without departing from the spirit and scope of the present invention. Also, the hierarchy need not be fully populated. For example, in the embodiment of FIG. 3, there may be only one (or at least less than N) second tier CAM device. (i.e., the other N−1 inputs to the top-tier CAM device being disabled, tied high or low, or left disconnected) and/or any of the second tier CAM devices may be coupled to only one (or at least less than N) bottom-tier CAM devices. Thus, the hierarchical CAM system of the present invention may be readily expanded to include additional tiers of CAM devices without requiring additional pins to be added to existing CAM devices and without increasing the HPM latency per added device.

Figure 5:
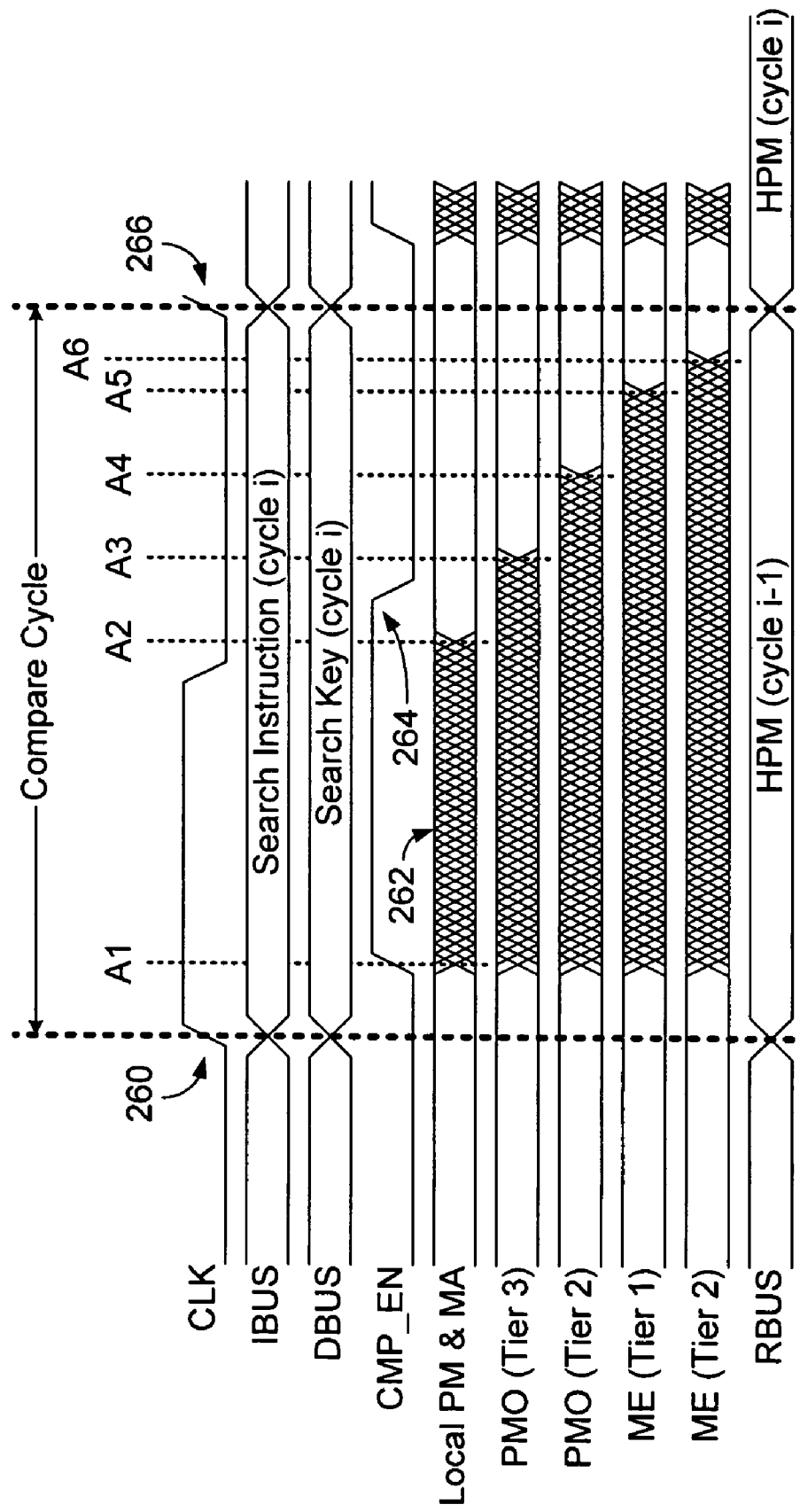
FIG. 5 is a timing diagram illustrating exemplary signal waveforms generated during a search operation performed within the hierarchical programmable-priority CAM system of FIG. 3.

FIG. 5 is a timing diagram illustrating exemplary signal waveforms generated during a search operation performed within the hierarchical programmable-priority CAM system 200 of FIG. 3. The search operation is initiated when a search instruction and search key (provided, for example, via an instruction bus (IBUS) and data bus (DBUS), respectively) are sampled at a rising edge 260 of a clock signal (CLK). An instruction decoder or other control circuit within each of the CAM devices 201 responds to the search instruction by asserting an internal compare-enable signal (CMP_EN) at time A1, thereby enabling the search key to be compared with contents of the local database. During the interval between times A1 and A2, each of the CAM devices 201 search their local databases, concluding with the production of a local PM value (match flag and priority number) and corresponding match address (MA) at time A2. The undefined state of the local PM value and match address between intervals A1 and A2 is represented in FIG. 5 by hash marks 262. Shortly after the local PM values become valid, the compare-enable signal is lowered (as shown at 264) to enable preparation for a subsequent search operation (e.g., precharging match lines and/or other signal lines within the CAM devices 201).

After the local PM values become valid at time A2, the tier 3 CAM devices (i.e., the bottom-tier CAM devices $201_{3,1}$-$201_{3,N^2}$ in the embodiment of FIG. 3) perform PM value compare operations to determine local priority winners, the local priority winners becoming valid at the tier 3 priority-match outputs at time A3. In an alternative embodiment, the bottom tier CAM devices may be configured to immediately output local PM values at their priority-match outputs without comparing the PM values with known invalid PM value inputs, thereby avoiding unnecessary delay in generating bottom-tier PM value outputs. When the tier 3 local priority winners become valid at the priority-match inputs of the tier 2 CAM devices $201_{2,1}$-$201_{2,N}$ (i.e., approximately at time A3), the tier 2 CAM devices perform PM value compare operations to resolve a second set of local priority winners, the local priority winners becoming valid at the tier 2 priority-match outputs at time A4. In the interval between times A4 and A5, the top-tier CAM device $201_{1,1}$ performs PM value compare operations to determine the final priority winner. At time A5, after the final priority winner has been determined, the top-tier CAM device $201_{1,1}$ executes an output enable operation, either sourcing the HPM itself or outputting a match enable signal to the tier 2 CAM device that produced or forwarded the final priority winner. Assuming that the top tier CAM device did not produce the final priority winner, the match enable signal initiates an output enable operation within the recipient mid-tier CAM device at time A6. At this point, the tier 2 CAM device either sources the HPM or outputs a match enable signal to the tier 3 CAM device that produces the final priority winner. In the latter case, shortly after time A6, the bottom-tier CAM device that produced the final priority winner is enabled to source the HPM.

Still referring to FIG. 5, in one embodiment, the CAM device that sourced the final priority winner, regardless of tier, outputs its local match address onto the result bus at the clock edge 266, at the start of a subsequent search cycle. By this operation, search operations are carried out for a given search cycle i+1, while the HPM for the prior search cycle i is presented on the result bus, thus allowing a pipelined sequence of search operations and HPM outputs. Also, while the search operation and final priority resolution is shown to be completed in a single clock cycle in FIG. 5, the search operation may be executed over a sequence of clock cycles, with individual stages in the search operation being carried out in respective clock cycles or sets of clock cycles.

Figure 6:
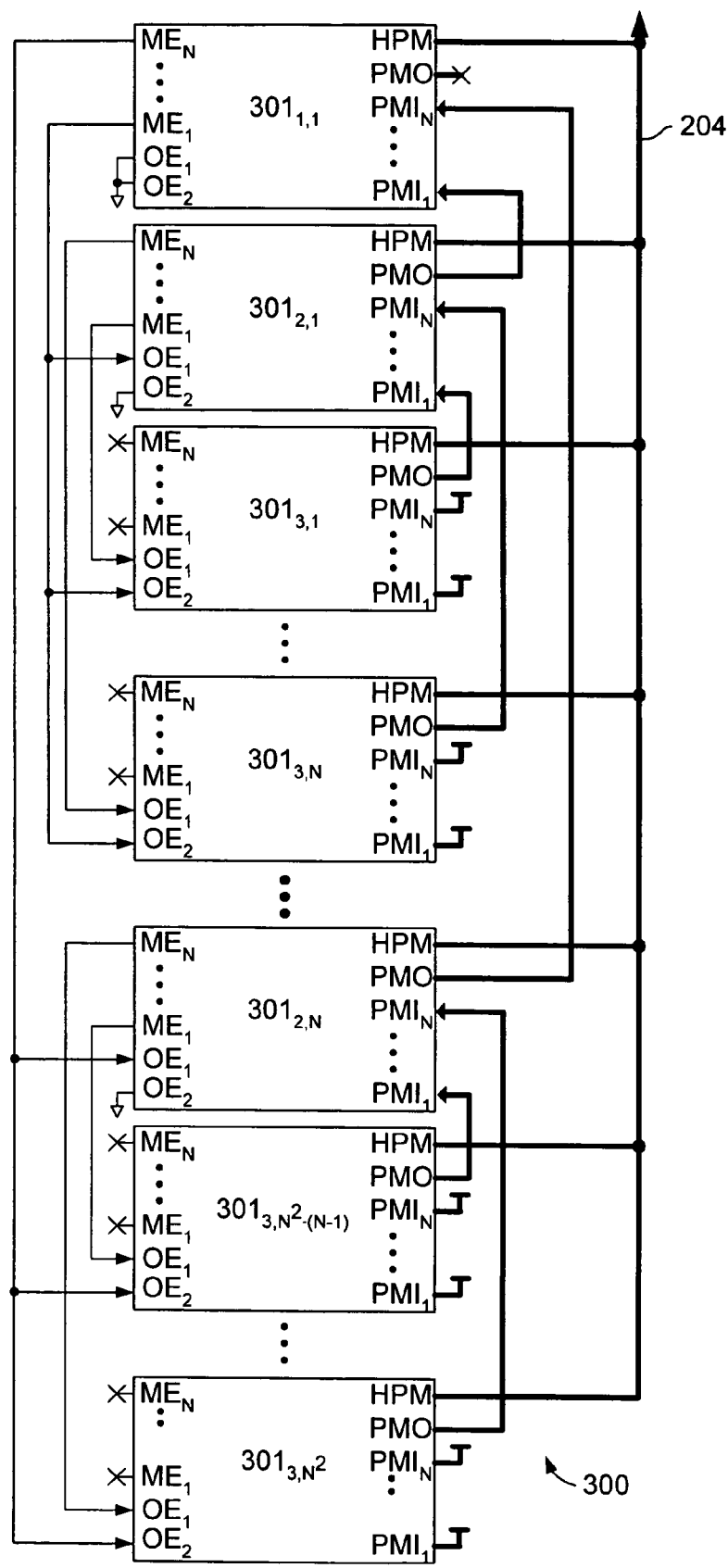
FIG. 6 illustrates an embodiment of a cumulative-enable, hierarchical programmable-priority CAM system.

FIG. 6 illustrates an embodiment of a cumulative-enable, hierarchical CAM system 300. CAM system 300 of FIG. 6 includes three tiers of CAM devices 301 having priority-match-inputs and priority-match outputs coupled in generally the same manner as in FIG. 3, and having cascade logic circuits (not specifically shown) to generate local priority winners and a final priority winner in the manner discussed in reference to FIG. 3. Also, each of the CAM devices 301 includes a match address output coupled to result bus 204 to output a HPM address thereon, as well as a set of N match enable outputs. Signal paths for delivering instructions, search keys, data and timing information are also coupled to the CAM devices, but not shown to avoid obscuring other signal paths.

In the particular three-tier embodiment of CAM system 300, each of the CAM devices 301 includes two output enable inputs ($OE_1$ and $OE_2$) instead of the single output enable input (OE) in the CAM devices 201 of FIG. 3. Also, the signal line used to deliver a match enable signal from a given parent CAM device to an output enable input of a child CAM device is additionally coupled to output enable inputs of all the descendants of the child CAM device. For example, match enable output $ME_1$ within the top-tier CAM device $301_{1,1}$ is supplied not only to $OE_1$ of child CAM device $302_{2,1}$ but also to $OE_2$ of grandchild devices $301_{3,1}$-$301_{3,N}$ (i.e., the child CAM devices of CAM device $302_{2,1}$). Similarly, match enable output $ME_N$ is coupled not only to $OE_1$ of child CAM device $301_{2,N}$, but also to $OE_2$ of grandchild CAM devices $301_{3,N^2-N+1}$-$301_{3,N^2}$. Also, the cascade logic circuit within each of the CAM devices is modified such that a given CAM device is enabled to source the HPM if (1) its local PM value is the local priority winner and (2) match enable signals are received at all the output enable inputs. Further, in contrast to the embodiment of FIG. 3, each CAM device performs an output enable operation upon determining a local priority winner, outputting a match enable signal to a child CAM device that produced the local priority winner or, if the local PM value was the local priority winner, storing an internal state (i.e., an internal match enable) to enable the local match address to be output as the HPM as soon as match signals are received at all output enable inputs. By this arrangement, as each tier of CAM devices 301 determines a local priority winner, the CAM device that produced the local priority winner receives a match enable signal at an output enable input or an internal match enable signal (i.e., if the local PM value is the local priority winner). For example, if CAM device $301_{3,N^2}$ sources the final priority winner in a given search operation, CAM device $301_{3,N^2}$ will record an internal state to indicate that it is the local priority winner in a bottom tier PM value comparison, then will receive a match enable signal at $OE_1$ when parent CAM device $301_{2,N}$ resolves a local priority winner. That is, parent CAM device $301_{2,N}$ will output match enable signal $ME_N$ upon determining that CAM device $301_{3,N^2}$ sourced the local priority winner. Finally, when the top tier CAM device $301_{1,1}$ determines that the local priority winner forwarded by CAM device $301_{2,N}$ is the final priority winner, the top-tier CAM device $301_{1,1}$ will assert match enable signal $ME_N$, thereby enabling CAM device $301_{3,N^2}$, which receives the match enable signal from the top-tier CAM device via $OE_2$, to source the HPM. Thus, the CAM device that produces a final priority winner cumulatively receives match enable signals at its output enable inputs, starting at the next higher tier and progressing until a match enable signal is received from the top-tier CAM device $301_{1,1}$. Because the top tier CAM device $301_{1,1}$ does not receive match enable signals from higher tier CAM devices, its output enable inputs are tied low (i.e., in an embodiment in which the match enable signals are active low signals). Similarly, because the tier 2 CAM devices receive match enable signals from only one higher tier CAM device, one of the two output enable inputs of each of CAM devices $301_{2,1}$-$301_{2,N}$ is tied low. In an alternative embodiment, the CAM devices may be programmed with topology information that indicates the tier to which they belong and, based on the topology information, bypass selected output enable inputs in determining whether to source the HPM.

Reflecting on the embodiment of FIG. 6, it can be seen that, by coupling the match enable output of a given CAM device not only to the corresponding child CAM device, but also to all the descendants of the child CAM device, it becomes unnecessary for match enable signals to hop (i.e., ripple) from tier to tier down through the CAM hierarchy. In the context of FIG. 5, the CAM device that produced the final priority winner is enabled to source the HPM when the top-tier CAM device outputs a match enable signal, thus avoiding the delay incurred in rippling the match enable signal through the tiers of CAM devices.

Figure 7:
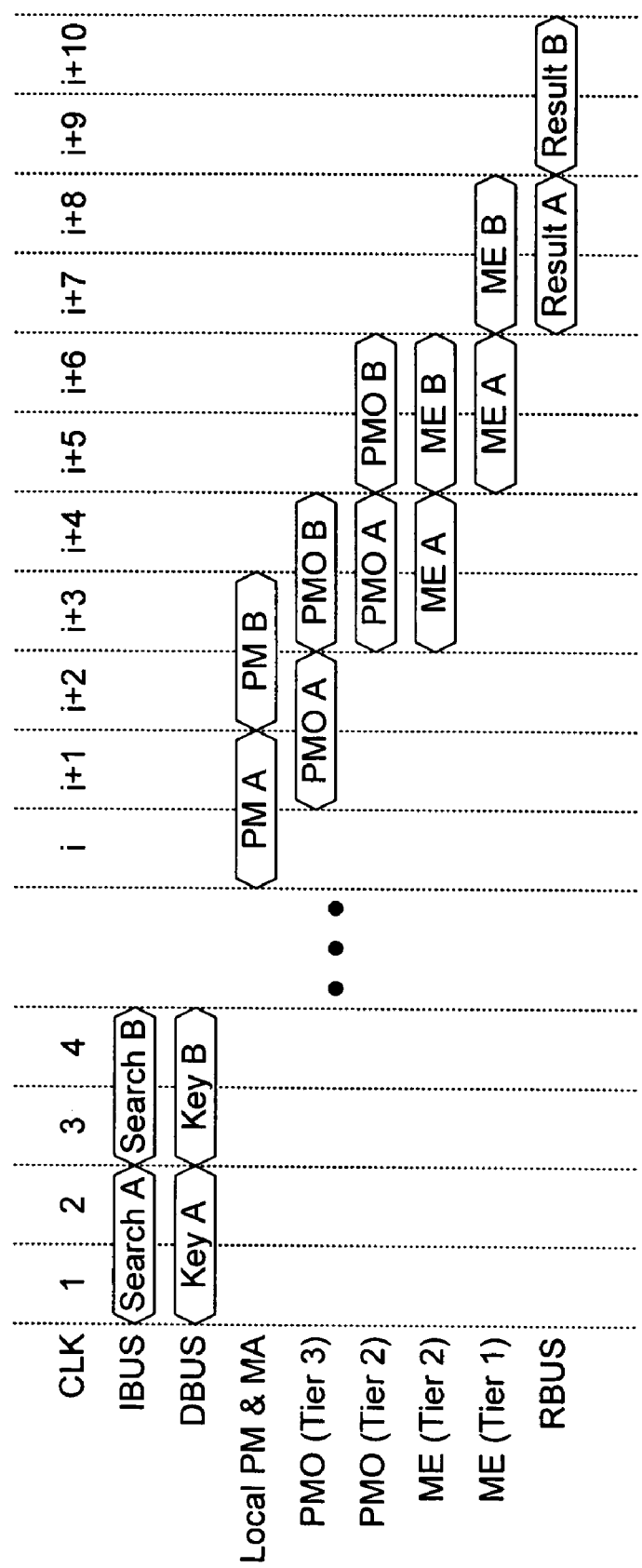
FIG. 7 is a timing diagram illustrating exemplary signal waveforms generated during a sequence of pipelined search operations performed within the hierarchical programmable-priority CAM system of FIG. 6.

FIG. 7 is a timing diagram illustrating exemplary signal waveforms generated during a sequence of pipelined search operations performed within the hierarchical programmable-priority CAM system 300 of FIG. 6. Initially, during cycles 1 and 2 of clock signal CLK, a first search instruction and corresponding search key, Search A and Key A, are received via the instruction bus and data bus, respectively. During subsequent clock cycles 3 and 4, a second search instruction and corresponding search key, Search B and Key B, are received, and additional search instructions and search keys (not shown) may continue to be received in subsequent clock cycles. During the interval from clock cycle 1 to clock cycle i, a multi-stage search operation is carried out within each of the CAM devices 301, with local PM and match address values that correspond to Search A (i.e., PM A) becoming valid at clock cycle i. Similarly, during the interval from clock cycle 3 to clock cycle i+2, multi-stage search operations are carried out within the CAM devices 301 to generate local PM and match address values that correspond to Search B. In one embodiment, each stage of the multi-stage search operation within a given CAM device 301 (e.g., compare operation within CAM array to generate match signals, latching of match signals in a match latch circuit, priority number resolution according to contents of match latch circuit, generation of match address and match flag according to results of priority number resolution), consumes one or more clock cycles so that, while a given stage of the search operation is being performed for Search A, the preceding search operation stage is carried out for Search B, thus enabling pipelining of successive search operations within the CAM devices 301. During clock cycles i+1 and i+2, after the local PM values and match addresses for Search A become valid, the tier 3 CAM devices output the local PM values generated in response to Search A via their priority-match outputs (i.e., as indicated by "PMO A" in the Tier 3 PMO waveform). During the ensuing pair of clock cycles, i+3 and i+4, the tier 2 CAM devices resolve local priority winners and output the corresponding PM values to the tier 1 CAM device, and also output a match enable signal (or latch an internal state) according to the local priority winner. During clock cycles, i+5 and i+6, the tier 1 CAM device resolves the final priority winner for Search A and outputs a match enable signal (ME A) or latches an internal state. Finally, during clock cycles i+7 to i+8, the CAM device that produced the final priority winner is enabled to source the HPM onto the result bus, as indicated by "Result A" in the result bus waveform.

Just as the internal search operation stages are pipelined within the individual CAM devices, the operations carried out to resolve the final priority winner and drive the result bus are pipelined to enable the results of successive compare operations to be output onto the result bus one after another. Thus, the local PM values and match addresses generated in response to Search B become valid during clock cycles i+2 and i+3; the tier 3 priority-match outputs for Search B become valid during clock cycles i+3 and i+4 (while the tier 2 priority-match outputs and match enable outputs for search A are valid); the tier 2 priority-match outputs and match enable outputs for Search B become valid during clock cycles i+5 and i+6 (while the tier 1 match enable output is valid for search A); the tier 1 match enable output becomes valid during clock cycles i+7 and i+8 (while the result bus is driven with the search result for Search A); and the search result for Search B is driven onto the result bus during clock cycles i+9 and i+10.

Reflecting on the timing diagram of FIG. 7, it should be noted that, while two pipelined search operations are illustrated, each stage of the pipeline (including internal search stages used to generate local PM values and match addresses) may be consumed by a separate search operation (i.e., the pipeline is fully loaded) so that a continuous stream of search operations are carried out within the CAM system 300, with a new result being output onto the result bus during each successive pair of clock cycles. Also, while two clock cycles are shown for many of the pipeline stages, such operations may alternatively be consumed in more or fewer clock cycles, or in fractions of a clock cycle as in FIG. 5. Further, while pipelined search operations have been described in the context of CAM system 300 of FIG. 6, pipelined search operations may similarly be executed for the CAM system 200 of FIG. 3.

Figure 8:
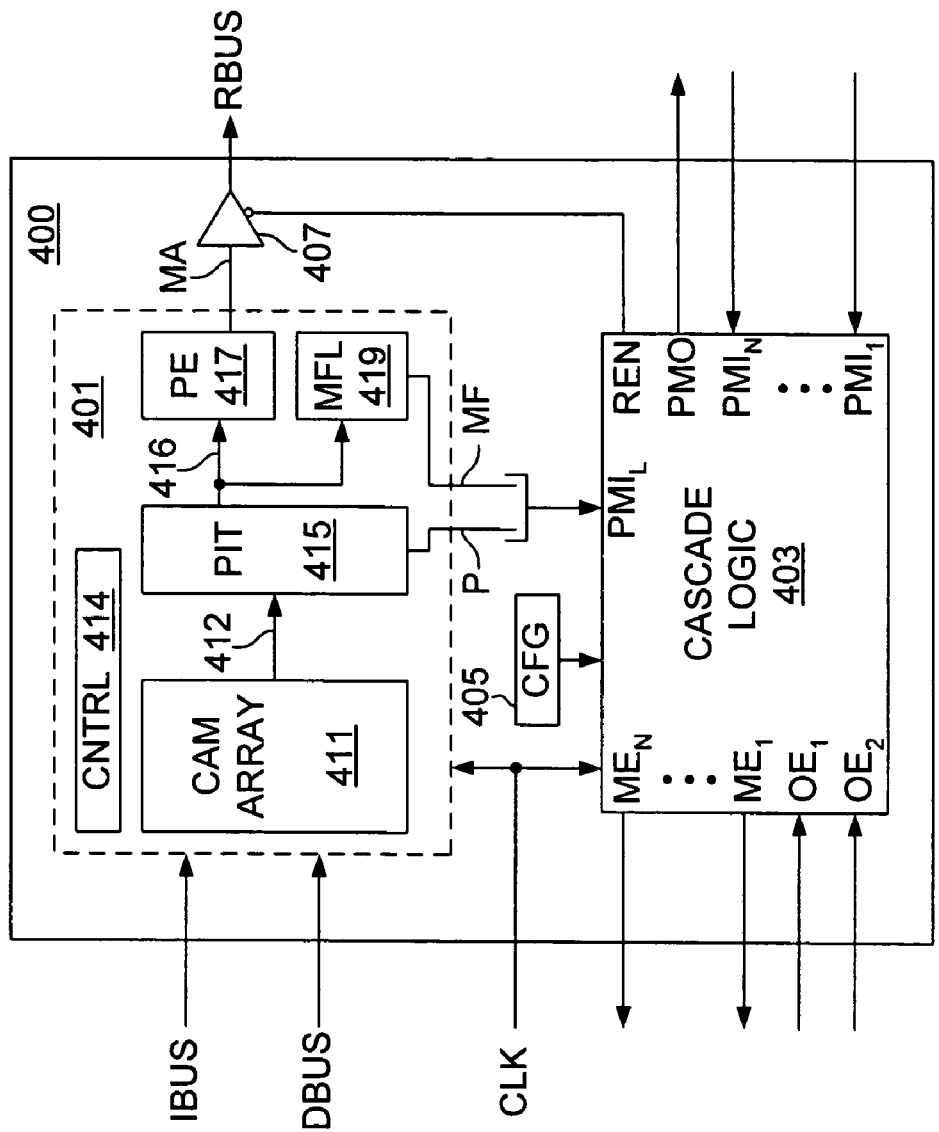
FIG. 8 illustrates a CAM device that may be used within a hierarchical programmable-priority CAM system according to an embodiment of the invention.

FIG. 8 illustrates a CAM device 400 that may be used within a hierarchical programmable-priority CAM system according to an embodiment of the invention. The CAM device 400 includes a core CAM 401, cascade logic circuit 403, configuration circuit 405 (CFG) and tri-state output driver 407. The core CAM 401 includes circuitry for generating the local PM value and match address described above in reference to FIGS. 3-6. More specifically, the core CAM 401 includes a CAM array 411, control circuit 414 (CNTRL, e.g., an instruction decoder), priority index table 415 (PIT), priority encoder 417 (PE) and match flag logic 419 (MFL). The CAM array 411 includes CAM cells arranged in rows and columns to store a database of data words, with each CAM cell including one or more storage elements (e.g., a volatile or nonvolatile storage cell) and one or more compare circuits for comparing the contents of the storage elements. The CAM cells may be binary CAM cells, ternary CAM cells (i.e., capable of storing a "don't care" state in which a bit or bits of a data word are indicated to match corresponding bits of a search key regardless of the state of the data bits), quaternary CAM cells (having, an "always match" state in addition to the high, low and don't care states) or any other type of CAM cell that may be used to signal a match or mismatch condition between contents of the search key and contents of the storage elements within the CAM cell. In one embodiment, each row of CAM cells within the CAM array is coupled to a respective one of a plurality of match lines 412 and, during a search operation, affects the state of the match line (e.g., pulling it low or leaving it in a precharged state) to indicate a match result for the row. The match lines 412 are coupled to corresponding priority number storage circuits and priority number compare circuitry within the priority index table 415. During a search operation, all the priority numbers within the priority index table 415 for which the corresponding match lines 412 indicates match conditions (i.e., the match-enabled priority numbers) are compared with one another to determine the local priority number (i.e., highest-priority, match-enabled priority number). The priority index table 415 outputs the local priority number (P) to the cascade logic circuit 403 and additionally activates a corresponding one of a plurality of qualified match lines 416 (if matches are detected in rows of CAM cells associated with the same highest-priority priority numbers, multiple qualified match lines 416 may be activated). The qualified match lines 416 are coupled to the priority encoder 417 and to the match flag logic 419. The priority encoder 417 generates the local match address (MA) in accordance with the state of the qualified match lines 416, and the match flag logic 419 asserts the local match flag (MF) if one or more of the qualified match lines 416 is activated. The local match flag is output to the cascade logic circuit 403 along with the local priority number (thus constituting the local PM value) and the local match address is supplied to an input of the tri-state output driver 407.

Still referring to FIG. 8, the core CAM 401 may include a number of other circuit elements not shown in FIG. 8 including, without limitation, read/write circuitry to enable read and write access to the CAM array 411, configuration circuitry for configuring the logical width and depth of the CAM array 411 (e.g., logically dividing a row of CAM cells into two or more row segments that may be individually searched), a key register to store an incoming search key, circuitry for masking selected fields (or bits) and reordering selected fields (or bits) of a search key, error detection circuitry, error correction circuitry, and so forth. Also, other CAM architectures may be used to implement the core CAM 401. For example, in an alternative embodiment, a programmable priority encoder or other circuit that allows selectable priorities or priority policies to be associated with database entries or groups of database entries may be used in place of the priority index table. In another alternative embodiment, one or more hash CAM blocks are used to implement the core CAM 401. In a hash CAM block, a hash index is generated based upon selected portions (or all) of a data word to be stored within the database, with the data word being stored in the database at an address indicated by or selected by the hash index. During a search operation, a search index is generated based upon selected portions (or all) of an incoming search key using the same hashing technique and/or circuitry used to generate hash indices for data word storage. An entry is read from the database storage at the location indicated or selected by the search index, then compared with the search key to determine whether a matching entry has been located. If a matching entry is located within one of the hash CAM blocks, the database storage location of the matching entry is output as a match address, and a priority number stored with or otherwise associated with the entry is output (i.e., produced) along with a match flag as a local PM value. If more than one match is detected, then the highest priority match is resolved by priority number comparison.

Still referring to FIG. 8, a clock signal (CLK) is provided to the core CAM 401 and cascade logic circuit 403 to provide timing references for operations carried out therein. The clock signal may be used directly within the core CAM 401 and/or cascade logic circuit 403, or may be used to derive other clock signals (e.g., using a clock tree circuit, phase-locked loop circuit, delay-locked loop circuit or the like). Also, separate clock signals may be provided to the cascade logic circuit 403 and the core CAM 401 in alternative embodiments. An instruction bus (IBUS) is provided for transmission of instructions to the core CAM (the instructions may alternatively be considered or referred to as commands or requests), a data bus (DBUS) is provided for transmission of corresponding search keys (or data words being written or read from the core CAM) and a result bus (RBUS) is coupled to the output of the tri-state output driver 407 for transmission of match addresses produced within the core CAM 401. In alternative embodiments, one or more of the instruction bus, data bus and result bus may be eliminated and the signals otherwise carried thereon multiplexed onto another of the buses.

The cascade logic circuit 403 includes a local priority-match input ($PMI_L$) coupled to receive the local PM value from the core CAM 401, and N priority-match inputs ($PMI_1$-$PMI_N$) and a priority-match output (PMO) to receive and output PM values as discussed in reference to FIGS. 3 and 6. The cascade logic circuit further includes match enable outputs $ME_1$-$ME_N$ to output match enable signals to up to N child CAM devices, output enable inputs $OE_1$ and $OE_2$ to receive match enable signals from higher tier CAM devices, and a result enable output (REN). Also, though not specifically shown, the cascade logic circuit 403 may include inputs for receiving multiple-match flags from child CAM devices and a local multiple-match flag from the CAM core 401. As discussed below, the cascade logic circuit 403 includes circuitry for performing PM value compare operations to determine a local priority winner and for selectively asserting match enable signals to child CAM devices (in accordance with signals received at the output enable inputs and internal state information) and selectively asserting the result enable signal to enable the tri-state output driver to output the local match address onto the result bus.

In the embodiment of FIG. 8, the cascade logic circuit 403 includes two output enable inputs, thus enabling application of the CAM device 400 in a cumulative-enable, hierarchical CAM system having up to three tiers of CAM devices as shown in FIG. 6. The CAM device 400 may have additional output enable inputs in alternative embodiments (e.g., T−1 output enable inputs to enable receipt of match signals from T−1 higher-tier CAM devices in a hierarchical CAM system having T tiers) or may have a single output enable input as in the sequential-enable CAM system 200 of FIG. 3.

Referring briefly to FIGS. 3 and 5, it can be seen that the PM values provided to a given CAM device become valid at a time that is dependent upon the position of the device within the hierarchical CAM system 200. For example, the PM values provided at the priority-match inputs of second-tier CAM devices $201_{2,1}$-$204_{2,N}$ become valid at time A4, while the PM values provided at the priority-match inputs of the first-tier CAM device $201_{1,1}$ become valid at a later time A5, after the second-tier CAM devices have resolved local priority winners. In the embodiment of FIG. 8, the configuration circuit 405 is used to control how long the CAM device 400 waits (e.g., relative to the start of a search operation, completion of a local search operation or other reference time) before performing a PM value compare operation, thereby ensuring that lower tier CAM devices are given sufficient time to resolve local priority winners and supply the local priority winners to the priority-match inputs of the CAM device 400. More specifically, in one embodiment, the configuration circuit 405 is programmed with a control value that is provided to the cascade logic circuit 403 to specify (directly or indirectly) the tier in which the CAM device 400 is disposed within a hierarchical CAM system. The cascade logic circuit 403, in turn controls the delay time (i.e., how long to wait relative to a given timing reference, before performing a PM value compare operation) based on the information (e.g., a control value) from the configuration circuit 405. In an alternative embodiment, the delay time may be expressly programmed within the configuration circuit 405. In either case, the programming operation may be a one-time programmable programming operation (e.g., burning fuses in a production-time programming operation) or a run-time programming operation (e.g., performed in response to an initialization instruction and associated configuration information received during system startup). Thus, the configuration circuit 405 may include a volatile or nonvolatile storage element or may include fused circuit elements (or other one-time programmable technology) that may be selectively opened to achieve the desired device configuration. Other information may also be stored within the configuration circuit including, without limitation, information that controls the logical configuration of the CAM array 411 within the CAM core 401, information that establishes a priority policy within the priority encoder 417 and/or cascade logic circuit 403, information that controls whether a given port of the cascade logic circuit 403 is an input port or output port and/or whether a given priority-match input, priority-match output, output enable input and/or match enable output is used or unused (e.g. to disable unused inputs and/or outputs).

Figure 9:
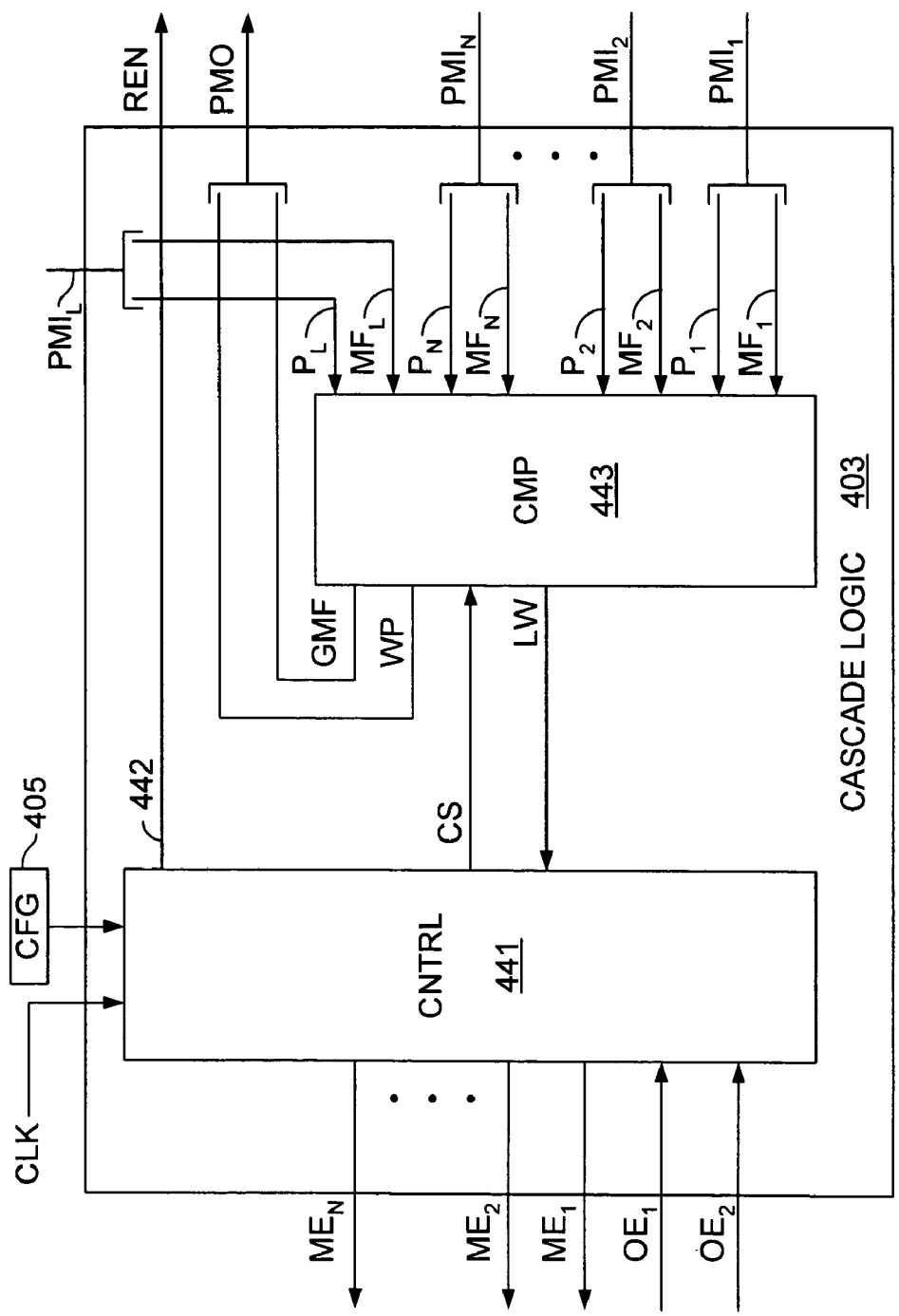
FIG. 9 illustrates a cascade logic circuit according to an embodiment of the invention.

FIG. 9 illustrates a cascade logic circuit 403 according to an embodiment of the invention. The cascade logic circuit 403 includes a controller 441 (CNTRL) and a compare circuit 443 (CMP). The compare circuit 443 receives PM values at the priority-match inputs of the cascade logic circuit 403 (i.e., at remote PM value inputs $PMI_1$-$PMI_N$ and at local PM value input $PMI_L$) and, upon receipt of a compare-strobe signal (CS) from the controller 441, compares the PM values to determine a local priority winner. That is, the compare circuit 443 compares the priority number components ($P_1$-$P_N$ and $P_L$) of the PM values for which the corresponding match flag component ($MF_1$-$MF_N$ and $MF_L$, respectively) is asserted to determine the highest-priority PM value. The compare circuit 443 outputs the winning priority number (WP) and corresponding match flag (group match flag, GMF) at the priority-match output (PMO). As discussed above, the cascade logic circuit 403 may receive multiple match flag signals from the child CAM devices and the CAM core, and may therefore generate a multiple match flag that is output to a higher tier CAM device or other device (i.e., the output multiple match flag indicating if any of the input multiple match flag inputs are asserted or if the winning priority number is received from two or more sources).

The compare circuit 443 additionally outputs a local winner value (LW) to the controller 441 to indicate the source of the local priority winner. In a sequential-enable embodiment, the controller 441 records the local winner until a match enable signal is received from a higher-tier CAM device (i.e., at an output enable input). If the local winner value specifies a child CAM device, then the controller 441 outputs a match enable signal on the corresponding match enable line (i.e., outputs one of signals $ME_1$-$ME_N$) in accordance with the local winner value. If the local winner value indicates that the local PM value is the local priority winner, then the controller 441 asserts a tri-state control signal 442 at the result enable output (REN) to enable the local match address to be output onto the result bus (e.g., to be driven onto the result bus by the tri-state output driver 407 of FIG. 8). In a cumulative-enable embodiment, the controller 441 immediately outputs one of match enable signals $ME_1$-$ME_N$ if the local winner value was provided by a child CAM device. Otherwise, if the local PM value is the local winner, the controller 441 asserts an internal enable signal (or otherwise sets an internal state) that is logically ANDed with signals received via the output enable inputs OE1 and OE2 to generate the tri-state control signal 442. By this operation, when match enable signals are received at all the output enable inputs (there may be more than two output enable inputs in alternative embodiments), the tri-state control signal 442 is asserted.

Still referring to FIG. 9, the clock signal (CLK) is supplied to the controller 441 to provide a timing reference for generation of the control strobe signal (CS) and to enable synchronization of selected signals (e.g., the tri-state control signal 442) with rising and/or falling edges of the clock signal. In one embodiment, the compare circuit 443 is implemented by combinatorial logic that requires no clocking information. In an alternative embodiment, the compare circuit 443 may perform comparisons in stages that are timed by the clock signal or one or more timing signals derived from the clock signal.

The configuration circuit 405 is also coupled to the controller 441 and supplies the controller 441 with the above-described configuration information to control how long the controller 441 waits relative to a clock signal edge or other timing reference (e.g., a signal from the core CAM that a search operation has been begun or is completed) before asserting the compare-strobe signal. Thus, if the configuration circuit indicates that the CAM device is a bottom-tier CAM device, the control circuit may accordingly issue the compare strobe signal immediately after the local PM value becomes valid. Conversely, if the configuration circuit indicates that the CAM device is a mid-tier or top-tier CAM device, the controller 441 may issue the compare-strobe signal after a delay interval that corresponds to the amount of time required for child CAM devices to supply valid PM values at the priority-match inputs, times that will differ for each tier of the hierarchical CAM system.

Although the invention has been described with reference to specific embodiments thereof, it will be evident that various modifications and changes may be made thereto without departing from the broader spirit and scope of the invention. The specification and drawings are, accordingly, to be regarded in an illustrative rather than restrictive sense.

What is claimed is:

1. A content addressable memory (CAM) system comprising:
   a first CAM device having a priority number output, a first enable input, a CAM core to output a local match address, and a cascade logic circuit to output the local match address from the first CAM device in response to assertion of a first enable signal at the first enable input;
   a second CAM device having a priority number input and an enable output coupled to the priority number output and the first enable input, respectively, of the first CAM device, the second CAM device further having a priority number output and an enable input; and
   a third CAM device having a priority number input and an enable output coupled to the priority number output and the enable input, respectively, of the second CAM device.

2. The system of claim 1 wherein the first CAM device additionally has a second enable input coupled to the enable output of the third CAM device.

3. The system of claim 1 further comprising an output bus coupled to each of the first, second and third CAM devices, and wherein the cascade logic circuit of the first CAM device is configured to output the match address onto the output bus in response to assertion of the first enable signal.

4. The system of claim 3 wherein the third CAM device comprises:
   a CAM core to output a local match address and a local priority value in response to a compare instruction; and
   a cascade logic circuit coupled to receive the local priority value from the CAM core and a remote priority value via the priority number input of the third CAM device, the cascade logic circuit being configured to assert a second enable signal via the enable output of the third CAM device if the remote priority value has a higher priority than the local priority value and to enable the local match address to be output onto the output bus if the local priority value has a higher priority than the remote priority value.

5. The system of claim 3 wherein the second CAM device comprises:
   a CAM core to output a local match address and a local priority value in response to a compare instruction; and
   a cascade logic circuit coupled to receive the local priority value from the CAM core and a remote priority value via the priority number input of the second CAM device, the cascade logic circuit being configured to assert the first enable signal via the enable output of the second CAM device if the remote priority value has a higher priority than the local priority value and to enable the local match address to be output onto the output bus if (1) the local priority value has a higher priority than the remote priority value and (2) if a second enable signal is received via the enable input of the second CAM device.

6. The system of claim 5 wherein the cascade logic circuit of the second CAM device is further configured to output the remote priority value via the priority number output of the second CAM device if the remote priority value has a higher priority than the local priority value and to output the local priority value via the priority number output of the second CAM device if the local priority value has a higher priority than then remote priority value.

7. The system of claim 3 wherein the CAM core of the first CAM device comprises circuitry to output a local priority value that corresponds to the local match address and wherein the cascade logic circuit includes circuitry to receive the local priority value from the CAM core of the first CAM device and to output the local priority value via the priority number output of the first CAM device.

8. The system of claim 1 further comprising an output bus coupled to each of the first, second and third CAM devices, and wherein the first CAM device additionally has a second enable input coupled to the enable output of the third CAM device, and wherein the cascade logic circuit includes circuitry to output the local match address onto the output bus in response to assertion of the first enable signal if a second enable signal is received via the second enable input of the first CAM device.

9. A content addressable memory (CAM) system comprising:
   a first CAM device to output a first priority value;
   a second CAM device coupled to receive the first priority value from the first CAM device and configured to output, as a winning priority value, a highest priority one of the first priority value and a second priority value; and a third CAM device coupled to receive the winning priority value from the second CAM device and configured to output a first enable signal to the second CAM device if the winning priority value has a higher priority than a third priority value.

10. The system of claim 9 further comprising an enable line coupled between the second and third CAM devices to conduct the first enable signal from the third CAM device to the second CAM device, and wherein the enable line is additionally coupled to the first CAM device to conduct the first enable signal thereto.

11. The system of claim 10 wherein the second CAM device is further configured to output a second enable signal to the first CAM device if the first priority value is the winning priority value.

12. The system of claim 9 wherein the second CAM device is further configured to output a second enable signal to the first CAM device if (1) the first priority value is the winning priority value and (2) the first enable signal is output by the third CAM device.

13. The system of claim 9 wherein the first CAM device includes a first CAM core to generate a first match address that corresponds to the first priority value, the second CAM device includes a second CAM core to generate a second match address that corresponds to the second priority value, and the third CAM device includes a third CAM core to generate a third match address that corresponds to the third priority value.

14. The system of claim 13 wherein the third CAM device is further configured to output the third match address onto an output bus if the third priority value has a higher priority than the winning priority value.

15. The system of claim 14 wherein the second CAM device is further configured to output the second match address onto the output bus if the third CAM device outputs the first enable signal and the second priority value is the winning priority value.

16. The system of claim 15 wherein the first CAM device is coupled to receive the first enable signal from the third CAM device, and wherein the second CAM device is further configured to output a second enable signal to the first CAM device if the first priority value is the winning priority value, and wherein the first CAM device is further configured to output the third match address onto the output bus if (1) the first CAM device outputs the first enable signal and (2) the second CAM device outputs the second enable signal.

17. The system of claim 14 wherein the second CAM device is further configured to output a second enable signal to the first CAM device if the third CAM device outputs the first enable signal and the first priority value is the winning priority value, and wherein the first CAM device is further configured to output the third match address onto the output bus in response to the second enable signal.

18. The system of claim 13 wherein each of the first, second and third CAM cores comprises a respective CAM array and a respective priority number storage circuit and is configured to:
compare a first compared value with contents of the CAM array to identify one or more local priority values within the priority number storage circuit;
output a highest priority one of the one or more local priority values from the priority number storage circuit; and
generate a match address that identifies a storage location within the CAM array that corresponds to the highest priority one of the one or more local priority values.

19. The system of claim 18 wherein the highest priority one of the one or more local priority values output from the priority number storage circuit of the first CAM core constitutes the first priority value, the highest priority one of the one or more local priority values output from the priority number storage circuit of the second CAM core constitutes the second priority value, and the highest priority one of the one or more local priority values output from the priority number storage circuit of the third CAM core constitutes the third priority value.

20. The CAM device of claim 18 wherein each of the first, second and third CAM cores comprises match lines coupled between the CAM array and the priority number storage circuit, each match line corresponding to a respective row of CAM cells within the CAM array; and wherein each of the first, second and third CAM cores is further configured to generate match signals on the match lines according to whether contents of the corresponding rows of CAM cells match the compared value, the match signals identifying the one or more local priority values.

21. A content addressable memory (CAM) device comprising:
a CAM core to output a local priority number; and
a cascade logic circuit coupled to the CAM core to receive the local priority number and having an input to receive at least one remote priority number from another CAM device, the cascade logic circuit being configured to compare the local priority number and the at least one remote priority number at one of a plurality of different times selected in response to a control value that indicates a disposition the CAM device within a hierarchy of interconnected CAM devices.

22. The CAM device of claim 21 further comprising a configuration circuit coupled to the cascade logic to provide the control value thereto.

23. The CAM device of claim 22 wherein the configuration circuit comprises a programmable non-volatile storage to store a configuration value, the configuration value including one or more bits that correspond to the control value.

24. The CAM device of claim 22 wherein the configuration circuit is a one-time programmable circuit.

25. The CAM device of claim 22 wherein the CAM core comprises an instruction decoder being coupled to the configuration circuit and configured to store configuration information within the configuration circuit in response to a configuration instruction from a host device, the configuration information including one or more bits that correspond to the control value.

26. The CAM device of claim 25 wherein the instruction decoder is configured to store, within the configuration circuit, configuration information that indicates the one of the plurality of different times in accordance with the disposition of the CAM device within the hierarchy of interconnected CAM devices.

27. The CAM device of claim 21 further comprising an interface to receive the control value.

28. The CAM device of claim 27 wherein the interface comprises one or more integrated circuit contacts.

29. A content addressable memory (CAM) device comprising:
a CAM core to generate a local priority value and corresponding match address; and
a cascade logic circuit coupled to receive the local priority value from the CAM core and having an input to receive a first enable signal from a first other CAM device, the cascade logic circuit being configured to compare the local priority value with a remote priority value received from a second other CAM device and to output a second enable signal to the second other CAM device if the remote priority value has a higher priority than the local priority value, the cascade logic circuit being further configured to enable the match address to be output from the CAM device if (1) the local priority value has a higher priority than the remote priority value and (2) the first enable signal is in a first state.

30. The CAM device of claim 29 further comprising a configuration circuit coupled to the cascade logic circuit to provide a control value thereto, and wherein the cascade logic is further configured to compare the local priority value with the remote priority value at a time indicated by the control value.

31. The CAM device of claim 30 further comprising an instruction decoder coupled to the configuration circuit and configured to store a configuration value therein in response to a configuration instruction from a host device, the configuration value including one or more bits that correspond to the control value.

32. The CAM device of claim 30 wherein the cascade logic circuit is further configured to disable the match address from being output from the CAM device if the remote priority value has a higher priority than the local priority value or if the first enable signal is in a second state.

33. The CAM device of claim 30 further comprising an output driver to output the match address from the CAM device if a control signal generated by the cascade logic circuit is in a drive-enable state, the cascade logic circuit being further configured to generate the control signal in the drive-enable state if (1) the local priority value has a higher priority than the remote priority value and (2) the first enable signal is in the first state.

34. A method of operation within a first content addressable memory (CAM) device, the method comprising:
generating a local priority value and corresponding match address;
comparing the local priority value with a remote priority value received from a second CAM device;
outputting an enable signal to the second CAM device if the remote priority value has a higher priority than the local priority value; and
outputting the match address from the first CAM device if the local priority value has a higher priority than the remote priority value and an enable signal is received from a third CAM device.

35. The method of claim 34 wherein outputting the match address comprises outputting the match address onto an output bus coupled to the first CAM device, second CAM device and third CAM device.

36. The method of claim 34 wherein comparing the local priority value with the remote priority value comprises comparing the local priority value with the remote priority value at one of a plurality of different times indicated by a control value.

37. The method of claim 36 further comprising storing the control value in a configuration circuit of the first CAM device.

38. The method of claim 37 wherein storing the control value in the configuration circuit comprises storing the control value in the configuration circuit in response to a command from a host device.

39. A method of operation within a content addressable memory (CAM) system, the method comprising:

outputting a first priority value from a first CAM device;
comparing a second priority value with the first priority value within a second CAM device and outputting a highest priority one of the first and second priority values; and
comparing a third priority value with the highest priority one of the first and second priority values within a third CAM device and, if the highest priority one of the first and second priority values has a higher priority than the third priority value, outputting a first enable signal from the third CAM device to the second CAM device.

40. The method of claim 39 further comprising outputting a second enable signal from the second CAM device to the first CAM device if the first value has a higher priority than the second value.

41. The method of claim 40 wherein outputting the second enable signal from the second CAM device to the first CAM device comprises outputting the second enable signal from the second CAM device to the first CAM device if (1) the first value has a higher priority than the second value and (2) the first enable signal is output from the third CAM device to the second CAM device.

42. The method of claim 40 further comprising:
generating a match address within the first CAM device, the match address corresponding to the first priority value; and
outputting the match address onto a result bus coupled to the first, second and third CAM devices if the second enable signal is output from the second CAM device to the first CAM device.

43. The method of claim 40 wherein outputting the first enable signal from the third CAM device to the second CAM device comprises outputting the first enable signal from the third CAM device to the first and second CAM devices.

44. The method of claim 43 further comprising:
generating a match address within the first CAM device, the match address corresponding to the first priority value; and
outputting the match address onto a result bus coupled to the first, second and third CAM devices if (1) the second enable signal is output from the second CAM device to the first CAM device and (2) the first enable signal is output from the third CAM device to the first CAM device.

45. The method of claim 39 further comprising:
generating a match address within the second CAM device, the match address corresponding to the second priority value; and
outputting the match address onto a result bus coupled to the first, second and third CAM devices if (1) the first enable signal is output from the third CAM device to the second CAM device and (2) the second priority value has a higher priority than the first priority value.

46. The method of claim 39 further comprising:
generating a match address within the third CAM device, the match address corresponding to the third priority value; and
outputting the match address onto a result bus coupled to the first, second and third CAM devices if the third priority value has a higher priority than the highest priority one of the first and second priority values.

47. The method of claim 39 wherein each of first, second and third priority values comprises a respective N-bit value, N being an integer greater than one.

48. The method of claim 39 wherein outputting a highest priority one of the first and second priority values comprises outputting a numerically lowest one of the first and second priority values.

49. A content addressable memory (CAM) device comprising:

means for generating a local priority value and corresponding match address;

means for comparing the local priority value with a remote priority value received from a first other CAM device;

means for outputting an enable signal to the first other CAM device if the remote priority value has a higher priority than the local priority value; and means for outputting the match address to an external signal path if the local priority value has a higher priority than the remote priority value and an enable signal is received from a second other CAM device.

* * * * *

UNITED STATES PATENT AND TRADEMARK OFFICE
CERTIFICATE OF CORRECTION

PATENT NO. : 7,337,267 B1  Page 1 of 1
APPLICATION NO. : 10/776441
DATED : February 26, 2008
INVENTOR(S) : Jose P. Pereira et al.

It is certified that error appears in the above-identified patent and that said Letters Patent is hereby corrected as shown below:

Column 7, line 41, change "priority number" to --the priority number--.

In the Claims:

Claim 21, column 20, line 31, change "disposition the" to --disposition of the--

Claim 47, column 23, line 1, change "each of first, second and third" to --each of the first, second and third--.

Signed and Sealed this

Twenty-fourth Day of June, 2008

JON W. DUDAS
*Director of the United States Patent and Trademark Office*